United States Patent
Venugopal et al.

(10) Patent No.: US 7,208,379 B2
(45) Date of Patent: Apr. 24, 2007

(54) PITCH MULTIPLICATION PROCESS

(75) Inventors: Ramesh Venugopal, Richardson, TX (US); Christoph Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 10/997,936

(22) Filed: Nov. 29, 2004

(65) Prior Publication Data
US 2006/0113636 A1    Jun. 1, 2006

(51) Int. Cl.
*H01L 21/336* (2006.01)
(52) U.S. Cl. .................. 438/279; 438/151; 257/390; 257/347
(58) Field of Classification Search .......... 257/5, 257/59, 288, 347, 368, 390; 438/197, 151, 438/279, 587, 589
See application file for complete search history.

(56) References Cited

U.S. PATENT DOCUMENTS 6,864,520 B2*  3/2005  Fischetti et al. ............ 257/255
2004/0264246 A1* 12/2004  Sakui et al. ............ 365/185.01
2006/0157709 A1*  7/2006  Green ........................ 257/72

OTHER PUBLICATIONS

Saito et al, "Suppression of Short Channel Effect in Triangular Parallel Wire Channel MOSFETs," IEICE Trans. Electron., vol. E85-C, No. 5, pp. 1073-1078, May 2002.

* cited by examiner

Primary Examiner—Tuan H. Nguyen
(74) Attorney, Agent, or Firm—Peter K. McLarty; W. James Brady, III; Frederick J. Telecky, Jr.

(57) ABSTRACT

A method for multiplying the pitch of a semiconductor device is disclosed. The method includes forming a patterned mask layer on a first layer, where the patterned mask layer has a first line width. The first layer can then be etched to form a first plurality of sloped sidewalls. After removing a portion of the patterned mask so that the patterned mask layer has a second line width less than the first line width, the first layer can be etched again to form a second plurality of sloped sidewalls. The patterned mask layer can then be removed. The first layer can be etched again to form a third plurality of sloped sidewalls. The first plurality of sloped sidewalls, the second plurality of sloped sidewalls, and the third plurality of sloped sidewalls can form an array of parallel triangular channels.

24 Claims, 4 Drawing Sheets

PITCH MULTIPLICATION PROCESS

FIELD OF THE INVENTION

The present invention relates to semiconductor devices and methods for decreasing a feature size of semiconductor devices. More particularly, the present invention relates to semiconductor devices and method for forming semiconductor devices with channel arrays having decreased line/space feature size and increased area for current flow.

BACKGROUND OF THE INVENTION

The desire for higher packing densities, faster circuit speed, and lower power dissipation has driven the scaling of semiconductor devices to smaller dimensions. Feature sizes for channel length, for example, have approached 0.1 µm (100 nm) for devices such as metal-oxide-semiconductor field effect transistors (MOSFETs). As the channel length of these devices decrease below 100 nm, however, problems arise.

One problem is that the gate oxide thickness must be reduced in proportion to the channel length to control short-channel effects and maintain a good subthreshold turn-off slope. As the thickness of the gate oxide decreases, quantum mechanical tunneling becomes a factor which leads to increased gate leakage. One solution to this problem is to form a corner dominated semiconductor device, which for a given oxide thickness, results in a steep subthreshold slope. Such a device should also be engineered to ensure that the effective area of current flow is not diminished.

A conventional corner dominated semiconductor device using triangular wire channels increases the number of corners and the area of current flow by providing a two-fold increase in the number of wire channels compared to a pillar- or rectangular-shaped wire channel. FIGS. 1A–1C show a conventional method of forming a triangular channel array. As shown in FIG. 1A, the conventional triangular channel array is made by forming a lithographic line pattern 30 on a silicon layer 20. In FIG. 1B, a first isotropic etch removes a portion of silicon layer 20 to form a plurality of structures 23 having sloped sidewalls. A selective oxidation forms an $SiO_2$ layer 40 on the sloped sidewalls of structures 23. Referring to FIG. 1C, lithographic line pattern 30 is removed and a second isotropic etch is performed. The second isotropic etch removes another portion of structures 23 to form additional sloped sidewalls that, together with the sloped sidewalls formed from the first isotropic etch, form a conventional parallel triangular wire array 25.

Conventional methods for forming corner dominated semiconductor devices, however, are limited to forming only two triangles for each lithographic line pattern 30. Further, the pitch of the resultant wire channel array is limited to two times the width of the lithographic line pattern, also called the "critical dimension."

Thus, there is a need to overcome these and other problems of the prior art and to provide a pitch multiplication process that increases the number of corners and maximizes the current flow area.

SUMMARY OF THE INVENTION

According to various embodiments, the present teachings include a method of forming a semiconductor device including forming a patterned mask layer on a first layer, wherein the patterned mask layer has a first line width. The first layer can then be etched to form a first plurality of sloped walls. A portion of the patterned mask can be removed so that the patterned mask layer has a second line width less than the first line width. The first layer can be etched to form a second plurality of sloped walls and the patterned mask layer can be removed. The first layer can then be etched to form a third plurality of sloped walls, wherein the first plurality of sloped sidewalls, the second plurality of sloped sidewalls, and the third plurality of sloped sidewalls form an array of parallel triangular channels.

According to various embodiments, the present teachings also include a method of forming a semiconductor device including forming a patterned mask layer on a silicon layer, wherein the patterned mask layer has a first line width. The silicon layer can be anisotropically etched to form a first plurality of sloped sidewalls. An oxide layer can then be formed on the first plurality of sloped sidewalls. The patterned mask layer can be etched so that the patterned mask layer has a second line width less than the first line width. The first silicon layer can be anisotropically etched to form a second plurality of sloped sidewalls. An oxide layer can be formed on the second plurality of sloped sidewalls and the patterned mask layer can be removed. The silicon layer can be anisotropically etched to form a third plurality of sloped sidewalls, wherein the first plurality sloped walls, the second plurality of sloped sidewalls, and the third plurality of sloped sidewalls form a triangular wire channel array.

According to various embodiments, the present teachings further include a method of forming a semiconductor device including forming a patterned mask layer on a silicon layer, wherein the patterned mask layer has a first line width. The silicon layer can be anisotropically etched to expose a first plurality of (111) planes and an oxide layer can be formed on the exposed first plurality of (111) planes. The patterned mask layer can then be etched to decrease the line width. The silicon layer can be anisotropically etching to expose a second plurality of (111) planes and an oxide layer can be formed on the exposed second plurality of (111) planes. The patterned mask layer can be removed and the silicon layer anisotropically etched to expose a third plurality of (111) planes, wherein the first plurality of (111) planes, the second plurality of (111) planes, and the third plurality of (111) planes form a triangular wire channel array.

According to various embodiments, the present teachings also include a semiconductor device including a first layer and a plurality of parallel triangular channels disposed on the first layer. The plurality of parallel triangular channels can have a pitch that is less than a critical dimension (CD).

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the terms "critical dimension" and "CD" refer to the width of an element in lithographic line pattern.

As used herein, the term "pitch" refers to the center-to-center distance between adjacent wire channels in a wire channel array.

FIGS. 2 to 7 depict exemplary semiconductor devices with parallel triangular wire channel arrays and manufacturing methods to form semiconductor devices with parallel triangular wire channel arrays in accordance with various embodiments of the invention. The semiconductor devices formed by the exemplary methods can increase the number of corners and the area over which current flows compared to conventional corner dominated devices. Further, the steep subthreshold voltage slope (due to improved gate electrostatics) permits the removal of dopants from the channel which in turn improves the carrier mobility, thus resulting in increased drive currents.

Figure 1A:
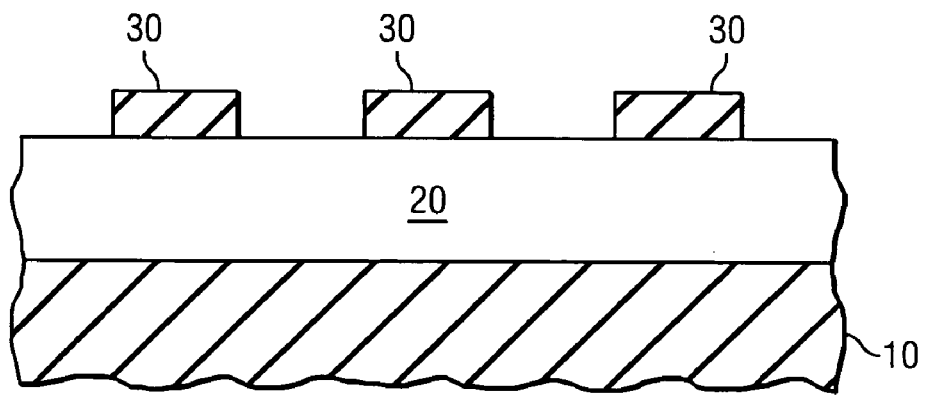
FIGS. 1A–C depict cross-sectional views of a conventional method for forming two triangular wires for each lithographic line.
Figure 1B:
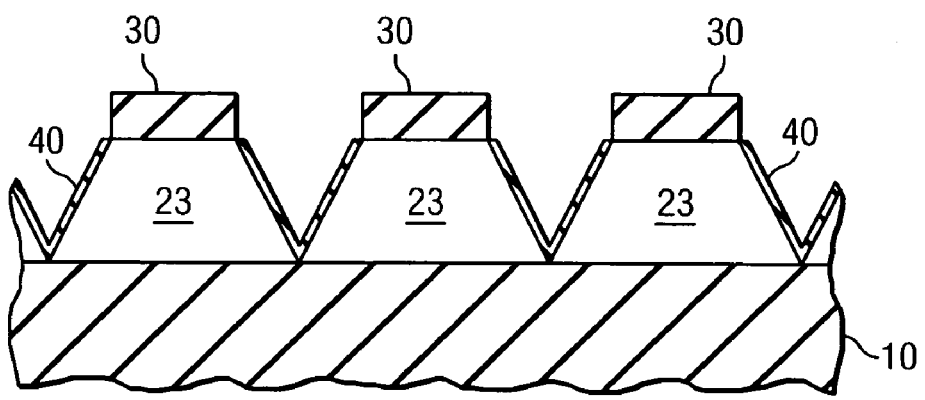
Figure 1C:
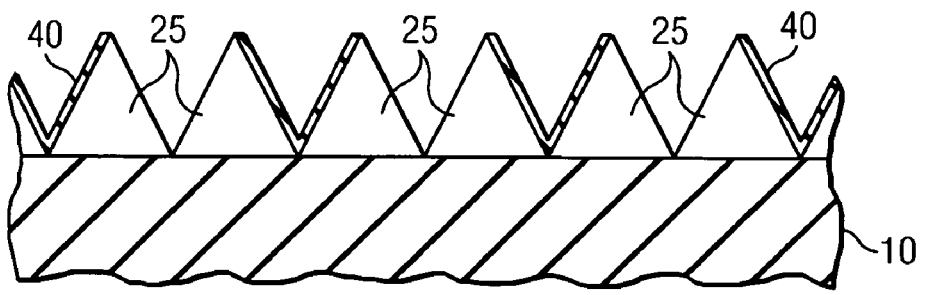
Figure 2:
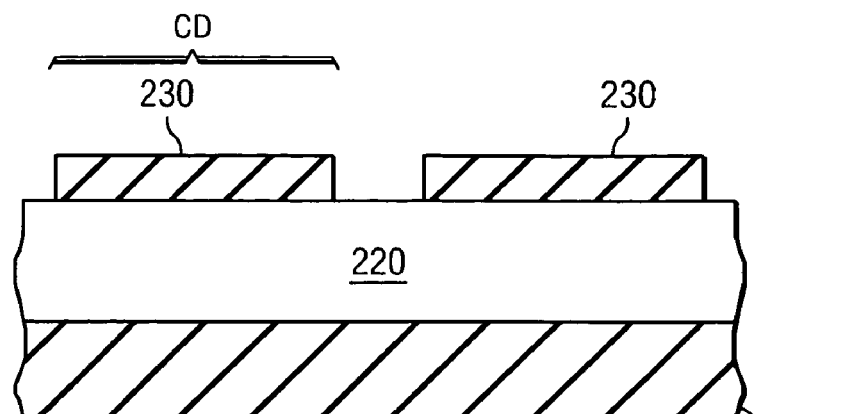
FIG. 2 depicts a cross-sectional view of patterned mask in a method for forming triangular wire channels in accordance with exemplary embodiments of the invention.
Figure 3:
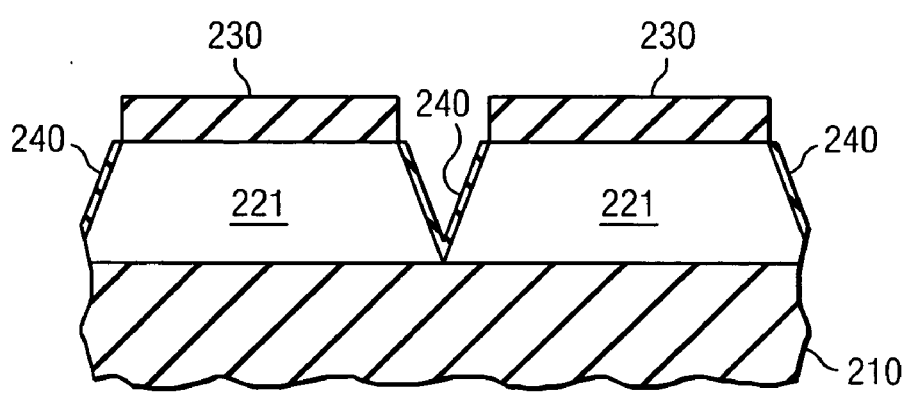
FIG. 3 depicts a cross-sectional view of a first plurality of sloped sidewalls formed in a method for forming triangular wire channels in accordance with exemplary embodiments of the invention.
Figure 4:
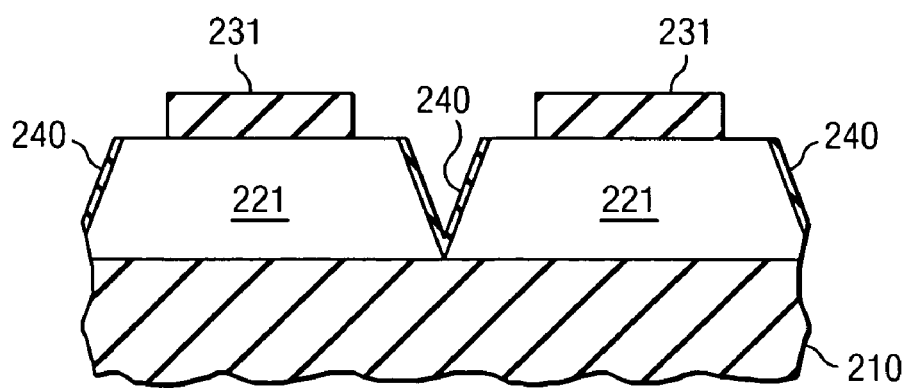
FIG. 4 depicts a cross-sectional view of reducing a lithographic line width of a patterned mask layer in a method for forming triangular wire channels in accordance with exemplary embodiments of the invention.

Methods for fabricating exemplary semiconductor devices with parallel triangular wire channel arrays in accordance with various embodiments of the invention will now be described. Referring to the cross-sectional view of FIG. 2, a first layer 220, a second layer 210, and a patterned mask layer 230 are shown. First layer 220 can be, for example, silicon. First layer 220 can be formed on second layer 210. Second layer 210 can be, for example, a silicon layer or a buried oxide layer and, in various embodiments, second layer 210 can be formed on a substrate (not shown). Patterned mask layer 230 can be formed on first layer 220 and can have a critical dimension, labeled CD, as shown in FIG. 2. Patterned mask 230 can be, for example, a nitride, such as silicon nitride, an oxide, such as silicon oxide, or a silicon oxy-nitride, and can be patterned by lithography techniques known to one of ordinary skill in the art.

In various embodiments, a first etch can be performed to remove a portion of first layer 220. Referring to the cross-sectional view of FIG. 3, the first etch can be an anisotropic etch that removes a portion of first layer 220 to form a first plurality of sloped sidewalls. The first plurality of sloped sidewalls can form structures 221. As used herein, the term "sloped sidewall" refers to a sidewall not at 90° relative to an top surface of second layer 210. The first anisotropic etch can use, for example, tetramthylammonium-hydroxide (TMAH) as an etchant. In various other embodiments, the etchant can comprise potassium hydroxide. According to various embodiments, an etch of first layer 220 comprising, for example, silicon (Si) can stop at an edge of patterned mask 230. According to various embodiments, etching of the silicon slows as the Si (111) planes are exposed in the first layer and, due to the slow etch rate of the Si (111) planes, essentially stops once the Si (111) planes are exposed. Thus, the first plurality of sloped sidewalls can be formed by the exposed Si (111) planes, each having an angle of about 54.7° relative to a top surface of second layer 210. An oxide mask 240, such as, for example, $SiO_2$ can then be formed on each of the first plurality of sloped sidewalls, i.e., the exposed Si (111) planes.

A portion of patterned mask layer 230 can then be removed. In various embodiments, a hot phosphoric acid etch can be used to remove a portion of patterned mask layer 230, for example, comprising silicon nitride to form a patterned mask layer 231, as shown in the cross-sectional view of FIG. 4. In various other embodiments, plasma etching, and reactive ion etching can be used to remove a portion of patterned mask layer 230. The portion of patterned mask layer 230 can be removed so that the lithographic line width of patterned mask layer 231 can be less than the CD of patterned mask layer 230. A second anisotropic etch can then be performed.

Figure 5:
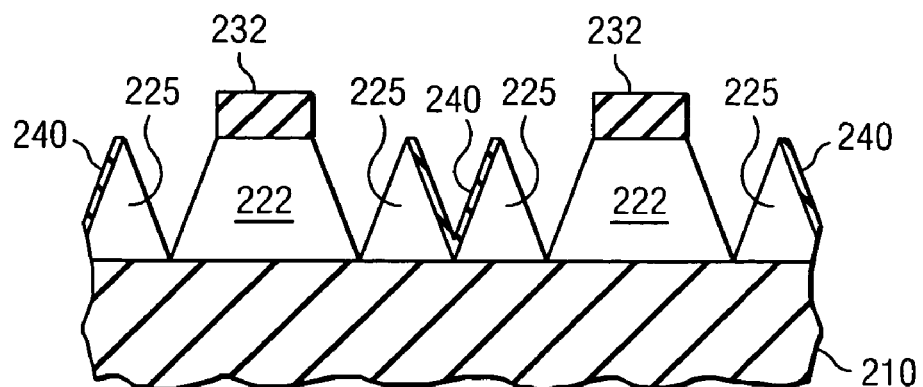
FIG. 5 depicts a cross-sectional view of a second plurality of sloped sidewalls formed in a method for forming triangular wire channels in accordance with exemplary embodiments of the invention.
Figure 6:
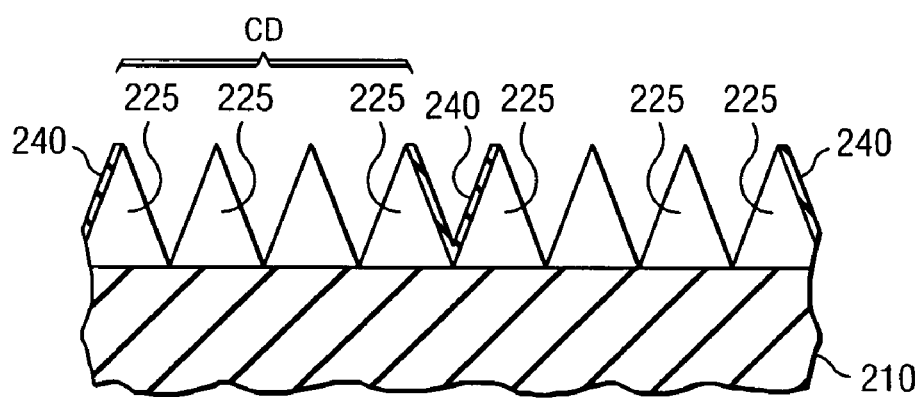
FIG. 6 depicts a cross-sectional view of a parallel triangular wire channel array in accordance with exemplary embodiments of the invention.

The second etch can remove another portion of first layer 220. Because oxide mask 240 and patterned mask layer 231 resist etching, formation of a second plurality of sloped sidewalls can occur. The second plurality of sloped sidewalls can form a plurality of structures 222 and a plurality of triangular structures 225, as shown in FIG. 5. In various embodiments, each of the sloped sidewalls of structures 222 and triangular structures 225 can be exposed (111) planes of silicon. The second etch can be an anisotropic etch using an etchant comprising, for example, TMAH. As further shown in the cross-sectional view of FIG. 5, oxide masks 240 can be formed on the second plurality of sloped sidewalls of structures 222 and triangular structures 225.

Patterned mask layer 232 can then be removed. In various embodiments, a hot phosphoric acid etch can be used to remove patterned mask layer 232. In various other embodiments, plasma etching, and reactive ion etching can be used to remove patterned mask layer 232.

A third etch can then be performed to remove a further portion of first layer 220. Because oxide masks 240 resist etching, formation of a third plurality of sloped sidewalls occurs. The third plurality of sidewalls, in conjunction with the first plurality of sloped sidewalls and the second plurality of sloped sidewalls, form a plurality of triangular structures 225, as shown in the cross-sectional view of FIG. 6. In various embodiments, each of the sloped sidewalls of the third plurality of sloped sidewalls can be exposed (111) planes of silicon. The third etch can be an anisotropic etch that uses, for example, an etchant comprising TMAH.

Figure 7:
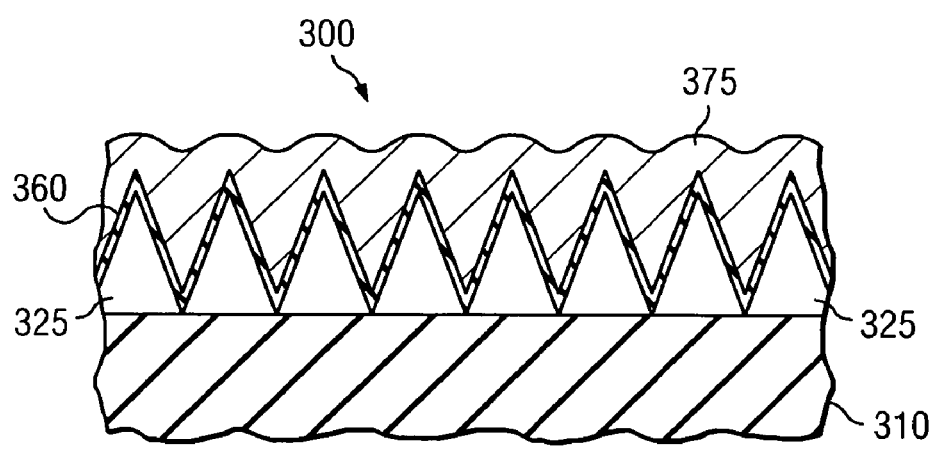
FIG. 7 depicts a cross-sectional view of a gate structure with a parallel triangular wire channel array in accordance with exemplary embodiments of the invention.

In various embodiments, a semiconductor device, such as, for example, a MOSFET or a junction field effect transistor (JFET), can include a gate structure including a silicon wire channel array comprising a plurality of parallel triangular wire channels. FIG. 7 shows a cross-sectional view of a triangular wire channel MOSFET 300 including a plurality of parallel triangular wire channels 325, buried oxide layer 310, a gate oxide 360, and a gate 375. In an exemplary embodiment, a base of each of the plurality of wire channels 325 can be about 15 nm and each of the base angles can be about 54.7°. Referring back to FIG. 2, wire channel 300 can be formed using patterned mask 230 having a CD of about 45 nm. The line patterns of the patterned mask can be separated from each other by about 15 nm. After formation of a first plurality of sloped walls, a width of patterned mask 230 can be reduced to about 15 nm to form patterned mask 231.

Wire channel array 300 can, for example, increase an effective width over which current flows compared to a convention wire channel array. Moreover, wire channel array 300 can have an increased number of corners compared to a conventional wire channel array, thus enabling further scaling of device size down to about 10 nm. A pitch of wire channel array 300 can also be increased to CD/2. One of ordinary skill in the art will understand that the above dimensions for triangular wire channels 225 and 325 are exemplary and that the dimensions can be varied as required for particular semiconductor device characteristics.

According to various embodiments described herein, gate lengths can be decreased to 30 nm or less and drain induced barrier lowering (DIBL) can be 50 mV/V or less. DIBL refers to the change in the threshold voltage as the drain voltage is increased by one volt. It can be measured, for example, by extracting a change in the threshold voltage ($V_T$) at high and low drain voltages, and by normalizing the threshold voltage shift by the difference between the high and low drain voltage values. Moreover, according to various embodiments, the subthreshold voltage swing can be 70 mV/dec or less.

Figure 8A:
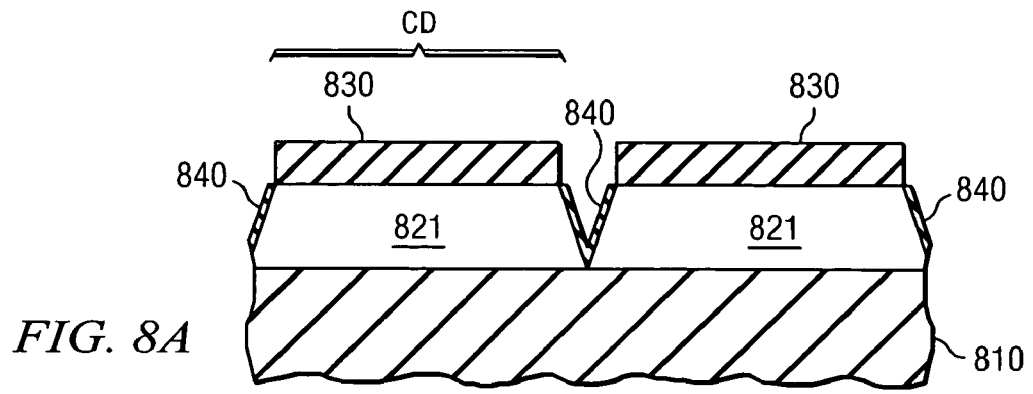
FIGS. 8A–8D depict cross sectional views of a method for multiplying the pitch of a triangular channel array in accordance with exemplary embodiments of the invention.
Figure 8B:
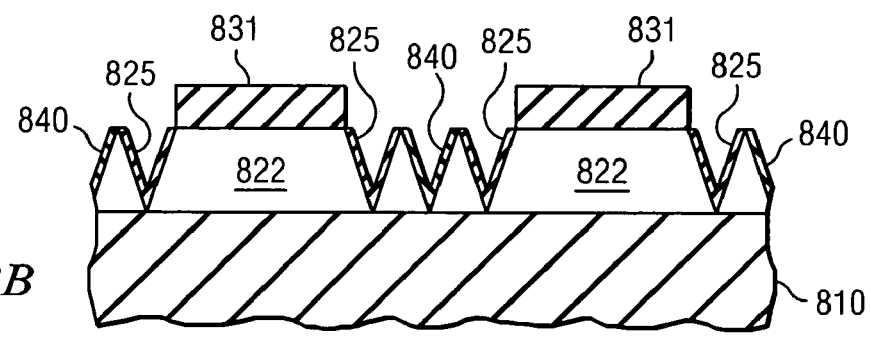
Figure 8C:
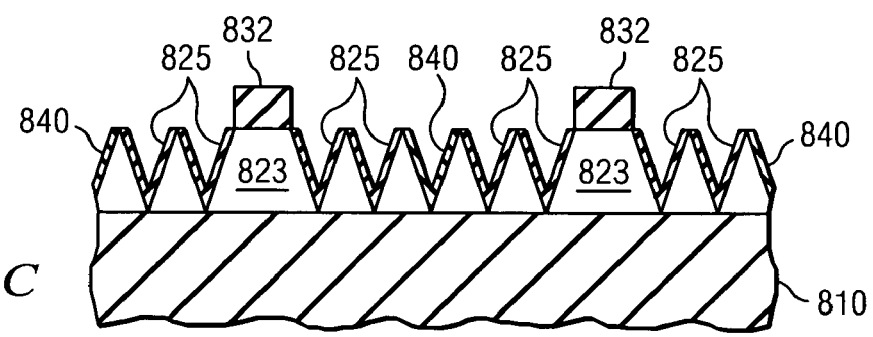

According to various embodiments, the pitch of the triangular wire channel array can be further multiplied, for example, by increasing the CD of the lithographic line pattern elements and/or decreasing the distance between each lithographic line pattern element. The method can proceed as described above, except that the steps of forming an oxide layer on the sloped sidewalls, reducing the lithographic line width of the patterned mask layer, and anisotropically etching the silicon layer can be repeated as necessary to multiply the pitch of the semiconductor device as desired. For example, in various embodiments, the pitch of a triangular channel array can be further multiplied so that six triangular channels can be formed from each lithographic line pattern element. Referring to FIG. 8, a patterned mask 830 having a CD of about 50 nm can be formed. The line patterns of the patterned mask can be separated from each other by about 10 nm. After formation of a first plurality of sloped walls by etching to form structures 821, oxide layers 840 can be formed on the first plurality of sloped sidewalls and a width of patterned mask 830 can be reduced to about 30 nm to form patterned mask 831 as shown in FIG. 8B. A second etch can be performed to form a second plurality of sloped sidewalls. The second plurality of sloped sidewalls, with the first plurality of sloped sidewalls, can form triangular structures 825 and structures 822. Referring to FIG. 8C, oxide layers 840 can be formed on the second plurality of sloped sidewalls and the width of patterned mask 831 can be reduced to about 10 nm to form patterned mask 832. A third etch can be performed to form a third plurality of sloped sidewalls. The third plurality of sloped sidewalls, with the first plurality of sloped sidewalls and the second plurality of sloped sidewalls, can form triangular structures 825 and structures 823.

Figure 8D:
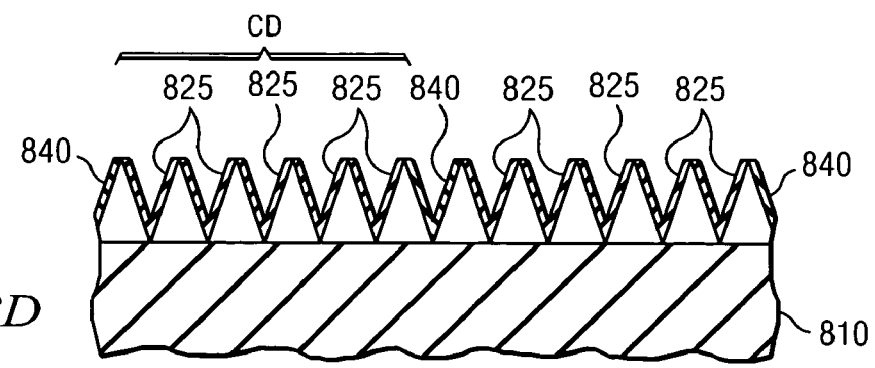

Oxide layers 840 can be formed on the third plurality of sloped sidewalls and patterned mask 832 can then be removed, as shown in FIG. 8D. A fourth etch can be performed to form a fourth plurality of sloped sidewalls. The fourth plurality of sloped sidewalls, with the first plurality of sloped sidewalls, the second plurality of sloped sidewalls, and the third plurality of sloped sidewalls, can form triangular structures 825. In an exemplary embodiment, triangular structures 825 can form a triangular wire channel array with each triangular wire channel having a base of about 10 nm and base angles of about 54.7°. One of skill in the are will understand that the pitch of the triangular wire channel array can be further multiplied by, for example, increasing the CD of each of the lithographic line pattern elements and performing additional steps of reducing the width of the lithographic line pattern elements, forming additional sloped sidewalls, and forming oxide layers on the sloped sidewalls.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device comprising:
   forming a patterned mask layer on a first layer, wherein the patterned mask layer has a first line width;
   etching the first layer to form a first plurality of sloped sidewalls;
   removing a portion of the patterned mask so that the patterned mask layer has a second line width less than the first line width;
   etching the first layer to form a second plurality of sloped sidewalls;
   removing the patterned mask layer; and
   etching the first layer to form a third plurality of sloped sidewalls, wherein the first plurality of sloped sidewalls, the second plurality of sloped sidewalls, and the third plurality of sloped sidewalls form an array of parallel triangular channels.

2. The method of claim 1, further comprising forming an oxide layer on the first plurality of sloped sidewalls after the step of etching the first layer to form a first plurality of sloped sidewalls.

3. The method of claim 2, further comprising forming an oxide layer on the second plurality of sloped sidewalls.

4. The method of claim 3, wherein the oxide layer on the first plurality of sloped sidewalls and the oxide layer on the second plurality of sloped sidewalls comprise $SiO_2$.

5. The method of claim 1, wherein etching the first layer to form the first plurality of sloped sidewalls exposes (111) planes of the first layer.

6. The method of claim 1, wherein etching the first layer comprises anisotropically etching the first layer using an etchant comprising tetramethylammonium-hydroxide.

7. The method of claim 1, wherein the patterned mask layer comprises a nitride.

8. The method of claim 1, wherein the first layer comprises silicon.

9. The method of claim 1, wherein removing a portion of the patterned mask layer comprises at least one of isotropically etching with an etchant comprising phosphoric acid, plasma etching, and reactive ion etching.

10. A method of forming a semiconductor device comprising:
    forming a patterned mask layer on a silicon layer, wherein the patterned mask layer has a first line width;
    anisotropically etching the silicon layer to form a first plurality of sloped sidewalls;
    forming an oxide layer on the first plurality of sloped sidewalls;
    etching the patterned mask layer so that the patterned mask layer has a second line width less than the first line width;
    anisotropically etching the first silicon layer to form a second plurality of sloped sidewalls;
    forming an oxide layer on the second plurality of sloped sidewalls;
    removing the patterned mask layer; and
    anisotropically etching the silicon layer to form a third plurality of sloped sidewalls, wherein the first plurality sloped sidewalls, the second plurality of sloped walls, and the third plurality of sloped sidewalls form a triangular wire channel array.

11. The method of claim 10, wherein the silicon layer is formed on at least one of a second silicon layer and a buried insulator layer.

12. The method of claim 10, wherein forming an oxide layer on the first plurality of sloped walls and forming an oxide layer on the second plurality of sloped walls comprises forming a SiO$_2$ layer.

13. The method of claim 10, wherein anisotropically etching the first layer comprises exposing the first layer to an etchant comprising tetramethylammonium-hydroxide.

14. The method of claim 10, wherein at least one of isotropically etching the patterned mask layer to form the second line width and removing the second patterned mask layer comprises isotropically etching with an etchant comprising phosphoric acid.

15. A method of forming a semiconductor device comprising:
    forming a patterned mask layer on a silicon layer, wherein the patterned mask layer has a line width;
    anisotropically etching the silicon layer to expose a first plurality of (111) planes;
    forming an oxide layer on the first plurality of (111) planes;
    etching the patterned mask layer to decrease the line width;
    anisotropically etching the silicon layer to expose a second plurality of (111) planes;
    forming an oxide layer on the second plurality of (111) planes;
    removing the patterned mask layer; and
    anisotropically etching the silicon layer to expose a third plurality of (111) planes, wherein the first plurality of (111) planes, the second plurality of (111) planes, and third plurality of (111) planes form a triangular wire channel array.

16. The method of claim 15, wherein after the step of forming an oxide layer on the second plurality of sloped walls, the method further comprises:
    etching the patterned mask layer to decrease the line width;
    anisotropically etching the silicon layer to expose an additional plurality of (111) planes;
    forming an oxide layer on the additional plurality of (111) planes; and
    repeating the etching, the anisotropic etching, and forming the oxide layer, sufficiently to form the triangular wire channel array.

17. A semiconductor device comprising:
    a first layer; and
    a plurality of parallel triangular channels disposed on the first layer, wherein a pitch of the plurality of parallel triangular channels is less than a critical dimension (CD).

18. The semiconductor device of claim 17, wherein the first layer is at least one of a buried oxide layer and a silicon layer.

19. The semiconductor device of claim 17, wherein a channel width of each of the plurality of parallel triangular channels is 15 nm or less.

20. The semiconductor device of claim 19, wherein a subthreshold swing is 70 mV/dec or less.

21. The semiconductor device of claim 19, wherein each of the plurality of parallel triangular channels has a height of 15 nm or less.

22. The semiconductor device of claim 17, wherein the pitch of the plurality of parallel triangular channels is CD/2 or less.

23. The semiconductor device of claim 17, wherein a gate length is about 30 nm or less and a drain induced barrier lowering (DIBL) is 50 mV/V or less.

24. The semiconductor device of claim 17, wherein the semiconductor device is one of a double gate metal-oxide-semiconductor field effect transistor (MOSFET) and a junction field effect transistor (JFET).

* * * * *